(12) United States Patent
Tai

(10) Patent No.: US 11,606,027 B2
(45) Date of Patent: *Mar. 14, 2023

(54) REGULATED VOLTAGE SYSTEMS AND METHODS USING INTRINSICALLY VARIED PROCESS CHARACTERISTICS

(71) Applicant: Taiwan Semiconductor Manufacturing Co., Inc., Hsinchu (TW)

(72) Inventor: Chia Liang Tai, Taichung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/588,717

(22) Filed: Jan. 31, 2022

(65) Prior Publication Data

US 2022/0158551 A1 May 19, 2022

Related U.S. Application Data

(60) Continuation of application No. 16/840,599, filed on Apr. 6, 2020, now Pat. No. 11,239,749, which is a division of application No. 15/218,126, filed on Jul. 25, 2016, now Pat. No. 10,637,351.

(51) Int. Cl.
*H02M 3/07* (2006.01)
*G01R 19/165* (2006.01)

(52) U.S. Cl.
CPC ........ *H02M 3/07* (2013.01); *G01R 19/16576* (2013.01); *H02M 3/072* (2021.05)

(58) Field of Classification Search
CPC .... H02M 3/07; H02M 3/072; G01R 19/16576
See application file for complete search history.

(56) References Cited

U.S. PATENT DOCUMENTS

| | | | |
|---|---|---|---|
| 5,365,129 A * | 11/1994 | Slemmer | G01R 19/16576 327/91 |
| 6,002,245 A | 12/1999 | Sauer | |
| 6,169,444 B1 | 1/2001 | Thurber, Jr. | |
| 6,300,820 B1 | 10/2001 | Fotouhi et al. | |
| 6,356,062 B1 | 3/2002 | Elmhurst et al. | |
| 6,359,814 B1 | 3/2002 | Sundaram et al. | |
| 6,456,153 B2 | 9/2002 | Buck et al. | |
| 6,522,558 B2 | 2/2003 | Henry | |
| 6,577,514 B2 | 6/2003 | Shor et al. | |
| 6,774,709 B2 | 8/2004 | Castaldo et al. | |
| 6,791,306 B2 | 9/2004 | Walters et al. | |
| 6,801,026 B2 | 10/2004 | Schrom et al. | |
| 6,903,599 B2 | 6/2005 | Chen et al. | |
| 6,906,499 B2 | 6/2005 | Hussein et al. | |
| 7,142,039 B2 | 11/2006 | Cheung et al. | |

(Continued)

*Primary Examiner* — Metasebia T Retebo
(74) *Attorney, Agent, or Firm* — Duane Morris LLP

(57) ABSTRACT

A regulator system includes a multi-bit detector system and a multi-cell charge/discharge circuit. The multi-bit detector system includes a plurality of detectors. Each of the plurality of detectors has a predetermined threshold voltage. The multi-cell charge/discharge circuit includes a plurality of charge pumps. Each of the charge pumps is configured to generate a predetermined charge. Each of the charge pumps is associated with a predetermined threshold voltage of the detector circuit.

20 Claims, 15 Drawing Sheets

(56) References Cited

U.S. PATENT DOCUMENTS

| | | |
|---|---|---|
| 7,276,960 B2 | 10/2007 | Peschke |
| 7,365,585 B2 | 4/2008 | Fort et al. |
| 7,843,252 B2 | 11/2010 | Schubert |
| 8,368,437 B2 | 2/2013 | Huang et al. |
| 8,456,207 B1 | 6/2013 | Kuo et al. |
| 8,547,151 B2 | 10/2013 | Kuo et al. |
| 8,570,082 B1 | 10/2013 | Kuo et al. |
| 8,593,189 B1 | 11/2013 | Yen et al. |
| 8,598,854 B2 | 12/2013 | Soenen et al. |
| 8,629,694 B1 | 1/2014 | Wang et al. |
| 8,629,706 B2 | 1/2014 | Chen et al. |
| 8,816,670 B2 | 8/2014 | Lee et al. |
| 8,890,626 B2 | 11/2014 | Chen et al. |
| 8,957,647 B2 | 2/2015 | Yang |
| 9,065,454 B2 | 6/2015 | Lin |
| 9,069,370 B2 | 6/2015 | Soenen et al. |
| 9,112,507 B2 | 8/2015 | Chen et al. |
| 11,239,749 B2 * | 2/2022 | Tai .................. H02M 3/07 |
| 2002/0084833 A1 * | 7/2002 | Kim .................. H02M 3/073 327/536 |
| 2006/0202668 A1 * | 9/2006 | Tran .................. G11C 5/145 323/215 |
| 2012/0176186 A1 | 7/2012 | Chen et al. |
| 2013/0241510 A1 | 9/2013 | Shi et al. |
| 2013/0285722 A1 | 10/2013 | Chou |
| 2013/0307516 A1 | 11/2013 | Horng et al. |
| 2013/0320944 A1 | 12/2013 | Siao |
| 2014/0266114 A1 | 9/2014 | Chern et al. |
| 2015/0162921 A1 | 6/2015 | Chen |
| 2015/0194971 A1 | 7/2015 | Tsai |
| 2015/0234403 A1 | 8/2015 | Siao et al. |
| 2015/0357918 A1 | 12/2015 | Roth et al. |

* cited by examiner

REGULATED VOLTAGE SYSTEMS AND METHODS USING INTRINSICALLY VARIED PROCESS CHARACTERISTICS

CROSS-REFERENCE TO RELATED APPLICATION

This application is a continuation of U.S. patent application Ser. No. 16/840,599 filed Apr. 6, 2020 which is a divisional of U.S. patent application Ser. No. 15/218,126, filed on Jul. 25, 2016, issued as U.S. Pat. No. 10,637,351 on Apr. 28, 2020, each of which are incorporated herein by reference in their entireties.

BACKGROUND

DC/DC voltage regulators generally consist of a reference system, a clock generator, and a boosting/bucking circuit. The regulator receives an input voltage and generates a boosted (stepped-up) or bucked (stepped-down) voltage as an output. In certain applications, such as memory or LED drivers, an input voltage is provided at a predetermined supply or ground and an output is a positive voltage higher than the supply voltage or a negative voltage less than the ground voltage.

A boosting/bucking circuit can be activated according to a reference system to produce an output at a predetermined level. The reference system determines the accuracy of the output. Current reference systems can utilize one or more architectures, such as a voltage comparator including a tapped output compared to a predetermined reference voltage or a level shifter configured to compare a segmented level voltage to a reference voltage.

Current reference systems generate large ripples and die-to-die inaccuracies in an average output voltage due to process variations. The process variations are caused by process deviations such as variations in device (e.g., MOS and/or resistor) dimensions, threshold voltage, mismatch in MOS/resistor ladders, and/or other sources. If the reference system has a variation from a predetermined level, the output cannot be set to a reliable level.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
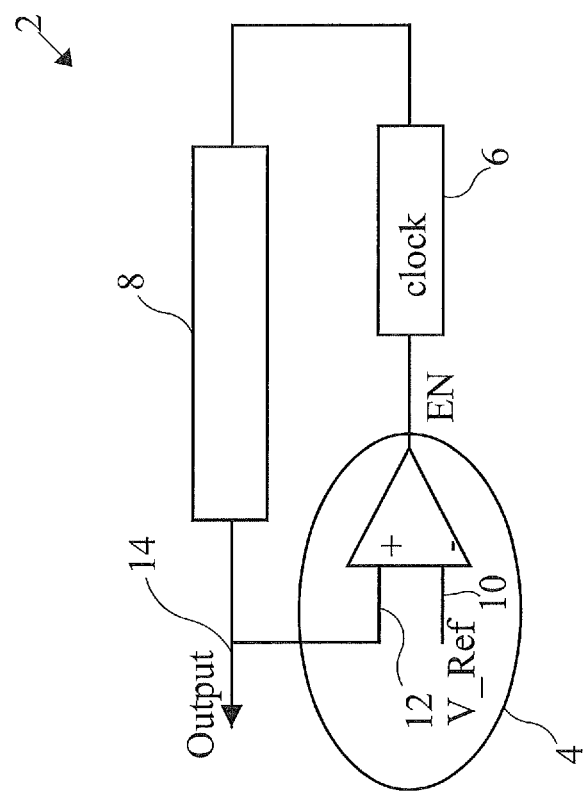
FIG. 1 illustrates a regulator circuit, in accordance with some embodiments.

The following disclosure provides many different embodiments, or examples, for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In various embodiments, a regulator circuit is disclosed having a smaller ripple across a current load and a reference circuit having a fixed decision level across the current load and process. The regulator circuit is separated into a plurality of unit charge pumps. The output of each of the unit charge pumps is shunted together. The reference system has a compensation approach for minimum decision level variation to provide a fixed level across the current load and process.

FIG. 1 illustrates one embodiment of a regulator circuit 2, in accordance with some embodiments. The regulator circuit 2 includes a level detector 4 (or reference/comparison circuit), a clock 6, and a charge/discharge circuit 8. The level detector 4 has a first input 10 coupled to a reference voltage $V_{ref}$. The reference voltage $V_{ref}$ can be a predetermined value and can be any suitable value, for example, a value greater than a supply voltage and/or less than ground. The level detector 4 has a second input 12 coupled to an output ($V_{out}$) 14 of the charge/discharge circuit 8. The level detector 4 compares the reference voltage $V_{ref}$ to the output 14 of the charge/discharge circuit 8 and compensates for variations in the output 14. In some embodiments, the regulator system circuit 2 includes a multi-cell detector and/or a multi-cell pumping circuit to reduce ripple in the output 14, as discussed in further detail below.

Figure 2:
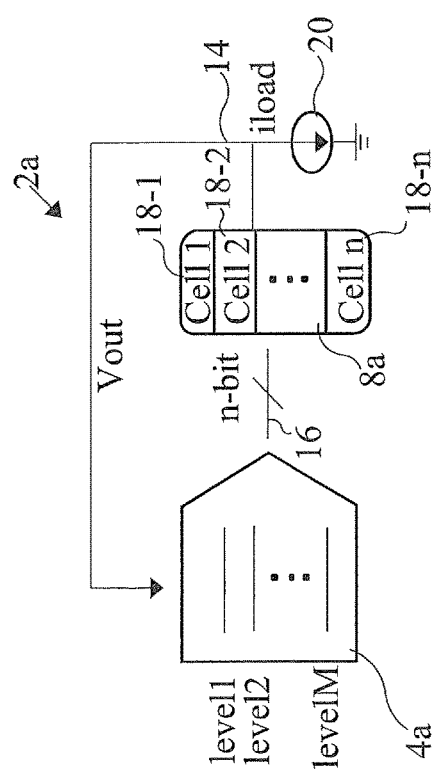
FIG. 2 illustrates a regulator circuit having a multi-level detector and a multi-cell charge/discharge circuit, in accordance with some embodiments.

FIG. 2 illustrates one embodiment of a regulator circuit 2a including a multi-level detector 4a and a multi-cell charge/ discharge circuit 8a. The multi-level detector 4a includes a plurality of detectors each configured to detect a predetermined voltage, current load, and/or other circuit parameter within a predetermined range. One embodiment of a detector is discussed in more detail below with respect to FIG. 6. The multi-level detector 4a can include a plurality of detectors each having a different detector level. In some embodiments, the detector level is determined intrinsically by process variations in the detectors that occur during formation thereof. The detectors can be compensated, for example, by a compensation circuit, to decrease the intrinsic trigger levels for one or more charge pumps 18_1-18_n, as discussed in more detail below with respect to FIG. 6. In some embodiments, the each of the detector levels is equal to M*x, where M is the detector number within the plurality of detectors and x is the voltage value between each level. For example, in some embodiments, each of the detector levels is separated by a voltage value x of 0.45 volts such that a first detector of the multi-bit detector has a trigger voltage of 0.45 volts, a second detector has a trigger voltage of 0.90 volts, etc. up to a maximum value of M*0.45 volts, where M is the total number of detectors in the multi-bit detector 4a. Although an example of 0.45 volts has been recited herein, it will be appreciated that the voltage value between each detector level can be smaller or greater than 0.45 volts and/or may vary from detector to detector.

In some embodiments, the multi-level detector 4a generates an n-bit output 16 corresponding to the plurality of levels activated by the detector 4a for a given output ($V_{out}$) 14. In some, embodiments, the number of bits n in the output 16 corresponds to the number of levels M of the multi-level detector 4a. In other embodiments, the number of bits n can be greater than the number of levels M of the multi-level detector 4a (activating multiple cells in the n-bit pumping cell 8a per detector level) and/or smaller than the number of levels M of the multi-level detector 4a. The n-bit output 16 can be provided to multi-cell charge/discharge circuit 8a having a plurality of charging pumps 18_1-18_n. Each of the charging pumps 18_1-18_n is configured to generate a predetermined charge, i.e., a predetermined energy value to maintain the output of the regulator circuit 2a at a predetermined value, such as a predetermined boost and/or buck value. One or more of the plurality of charge pumps 18_1-18_n are activated to maintain a predetermined output 14 to drive the load current $I_{load}$ 20. In some embodiments, the n-bit output 16 has a number of bits equal to the number of charge pumps 18_1-18_n in the multi-cell charge/discharge circuit 8a. Although embodiments having an n-bit output signal and n charging pumps 18_1-18_n are discussed herein, it will be appreciated that the number of bits in the output signal 16 may be greater than or less than the number of charge pumps 18_1-18_n in the multi-cell charge/discharge circuit 8a. For example, in some embodiments, an output signal 16 having fewer bits than cells in the charge/discharge circuit 8a can activate two or more pumping cells per bit change. In other embodiments, the charge pumps 18_1-18_n can include additional control logic configured to respond to a plurality of bits in the output signal 16 to control each of the pumping cells in the charge/discharge circuit 8a.

Figure 3:
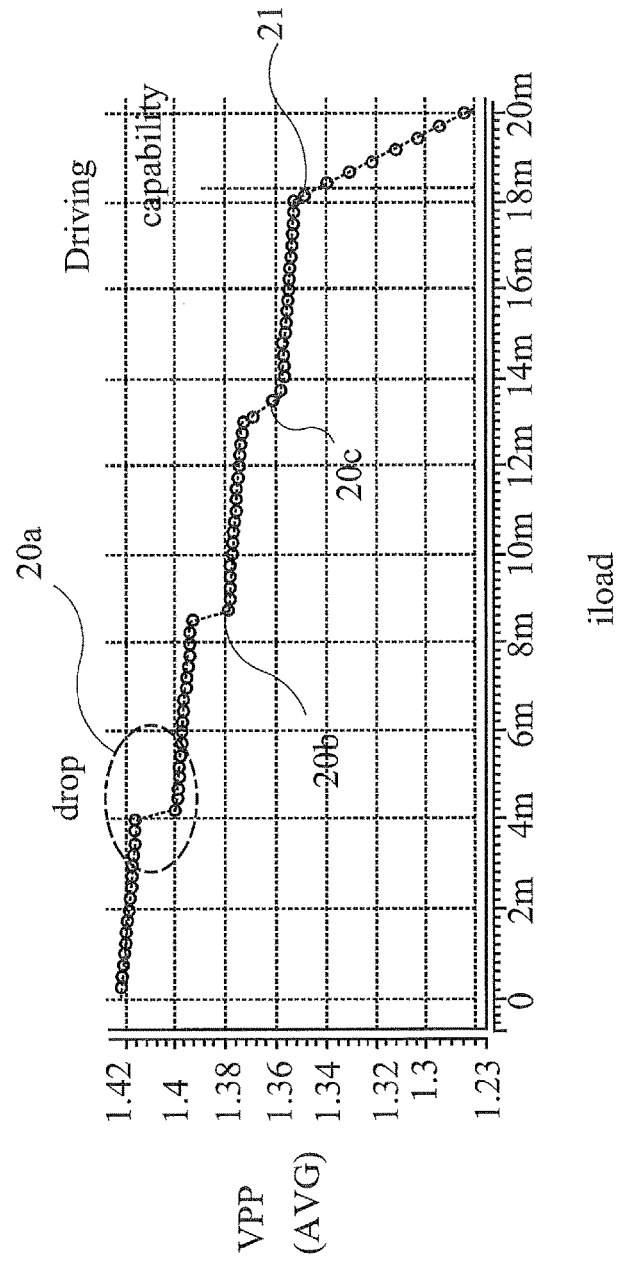
FIG. 3 is a chart illustrating a voltage drop of regulator circuit of FIG. 2.

FIG. 3 illustrates the average voltage $V_{PP}$ (also referred to herein as $V_{out}$) of the n-bit pumping cell 8a as $I_{load}$ increases, in accordance with one embodiment in which M=4. A plurality of voltage drops 20a-20c are shown in FIG. 3. Each of the voltage drops 20a-20c corresponds to activation of an additional charge pump 18_2-18_n within the 4-bit pumping cell 8a. The drop-off size is proportional to the size and number (n) of charge pumps 18_1-18_n within the charge/discharge circuit 8a. For example, a greater number of charge pumps, each having a smaller capacity, to generate the same voltage as a smaller number of larger charge pumps produces a smaller drop and provides a flatter voltage output than a smaller number of larger charge pumps.

Figure 4:
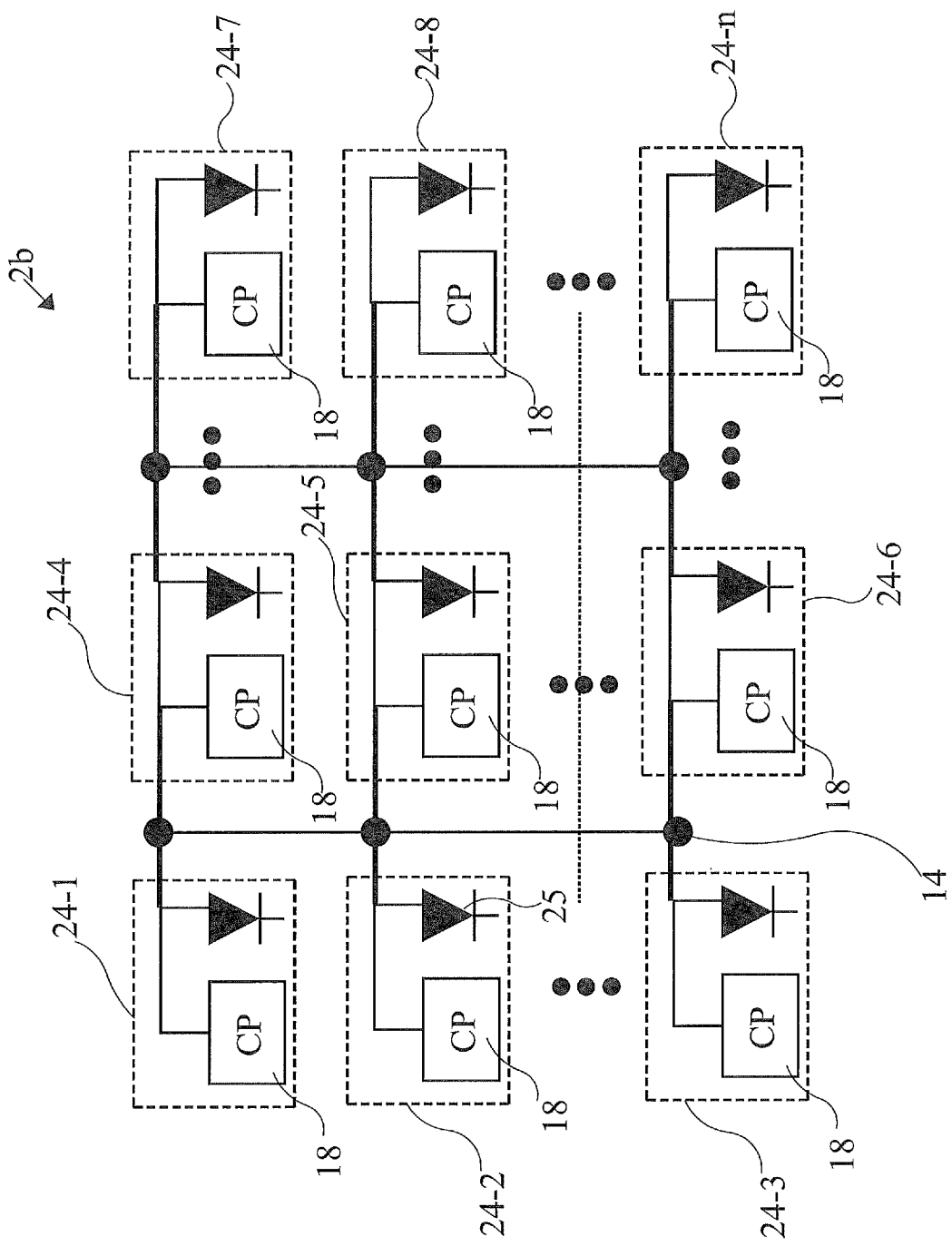
FIG. 4 illustrates a regulator circuit including a plurality of pumping cells each including a detector and a charge pump, in accordance with some embodiments.

FIG. 4 illustrates one embodiment of a regulator circuit 2b including a plurality of pumping cells 24_1-24_n. Each of the pumping cells 24_1-24_n includes a charge pump 18 and a controller/detector 4a, for example, as illustrated in FIG. 2. Each of the pumping cells 24_1-24_n is coupled to a load 25. In the illustrated embodiment, the load 25 is represented by a diode, although it will be appreciated that any suitable load can be included in each of the pumping cells 24_1-24_n. Each of the controllers 4a can be configured to activate a charge pump 18 at a predetermined detector level. The plurality of charge pumps 18 have their outputs 14 coupled together. The outputs 14 can be coupled in any suitable configuration, such as, for example, one or more serial connections and/or shunt connections, in accordance with various embodiments. The charge pumps 18 generate a predetermined charge configured to maintain a predetermined output voltage. As the load ($I_{load}$) on the regulator circuit 2b increases, additional charge pump 18_1-18_n are activated to generate additional pumping energy, or charge, up to a predetermined shut-off load. In some embodiments, each of the pumping cells 24_1-24_n has a predetermined detector level. The predetermined detector level is set by one or more process variations in the formation of the pumping cells 24_1-24_n. In some embodiments, a compensator (as described below with respect to FIG. 6) is configured to modify the intrinsic detector level by compensating for one or more of the process defects in the pumping cells 24_1-24_n.

In some embodiments, the plurality of pumping cells 24_1-24_n are identical and configured to generate substantially identical charge levels when activated (e.g., the charge generated by the charge pumps 18_1-18_n can vary by a predetermined margin of error). In other embodiments, the pumping cells 24_1-24_n can be configured to generate a plurality of charges when activated. For example, in some embodiments, the plurality of charge pumps 18_1-18_n can be configured to generate up to n charges, where n is equal to the number of charge pump 18s_1-18_n in the voltage regulator 2b. Each of the charge pumps 18_1-18_n generate a predetermined charge. For example, in some embodiments, each pumping cell 24_1-24_n is configured to generate a pre-charge voltage and a boost voltage, as discussed in more detail below with respect to FIGS. 9-14. In some embodiments, the pre-charge voltage is 1V and the boost voltage is 2V. When additional current loading is added to a circuit, one or more charge pumps 18 are activated to add additional charge to maintain a constant voltage and/or are transitioned to a boost state. In some embodiments, each of the charge pumps 18 is configured to generate the same predetermined charge (or energy).

Figure 5:
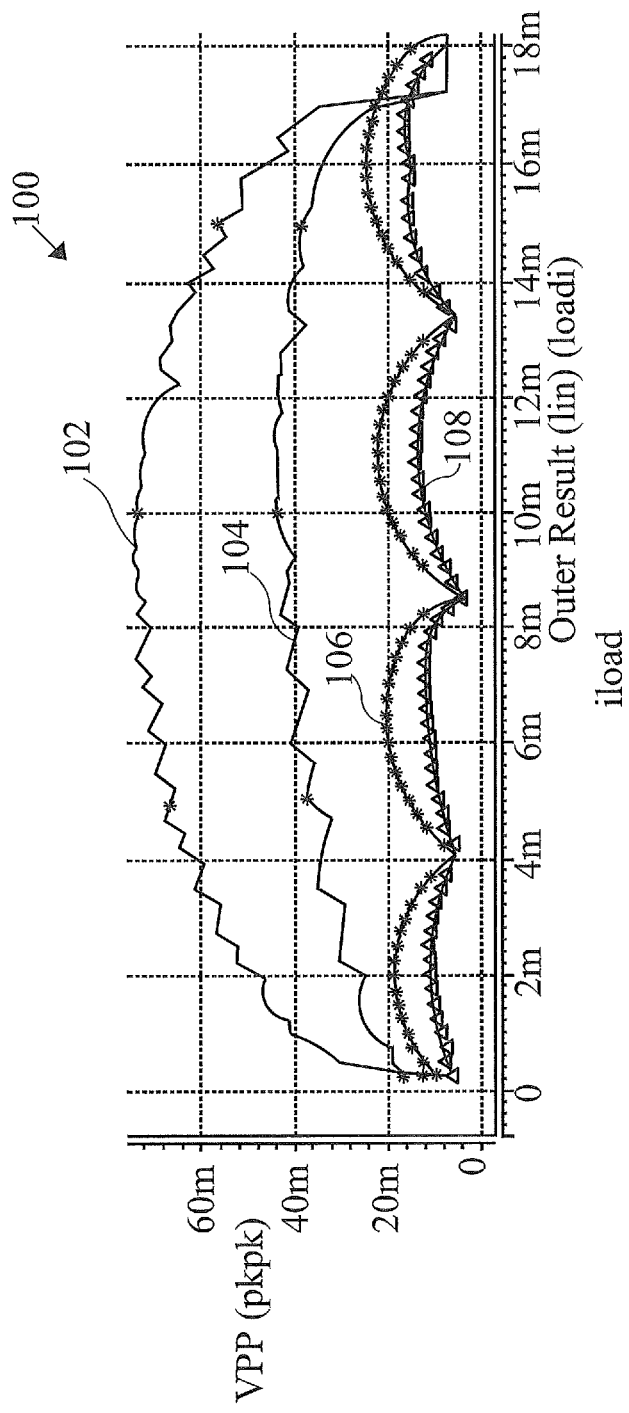
FIG. 5 is chart illustrating a peak-to-peak voltage (e.g., ripple) in various embodiments of regulator circuits each having the same maximum load capacity, in accordance with some embodiments.

FIG. 5 is chart 100 illustrating a ripple in various embodiments of pumping cells each having the same maximum load capacity. An output voltage ($V_{PP}$) is illustrated on the Y-axis and a current load ($I_{load}$) is illustrated on the X-axis. A first ripple 102 and a second ripple 104 are provided for regulator circuits having a single charging pump configured to produce a predetermined voltage, X. A third ripple 106 and a fourth ripple 108 are illustrated for 4-bit regulator circuits having four individually controlled charging pumps each configured to produce a predetermined charge. As shown in FIG. 5, each of the single charging pump pumping cells have a larger ripple 102, 104 than the ripple 106, 108 of the 4-bit regulator circuits. In some embodiments, the regulator circuits include control process compensation for one or more detectors configured to detect the voltage level of the load and to control the pumping cells as discussed in more detail below with respect to FIGS. 6-8C. For example, as shown in FIG. 5, a one-bit regulator circuits having a single detector without control process variation compensation produces a ripple 102 greater than a ripple 104 of a one-bit regulator circuits having a single detector with control process variation compensation. Similarly, a 4-bit regulator circuits using a multi-level detector without control process compensation produces a ripple 106 greater than a ripple 108 generated by a 4-bit regulator circuits using a multi-level detector including a plurality of detectors having control process variation compensation, as discussed below.

Figure 6:
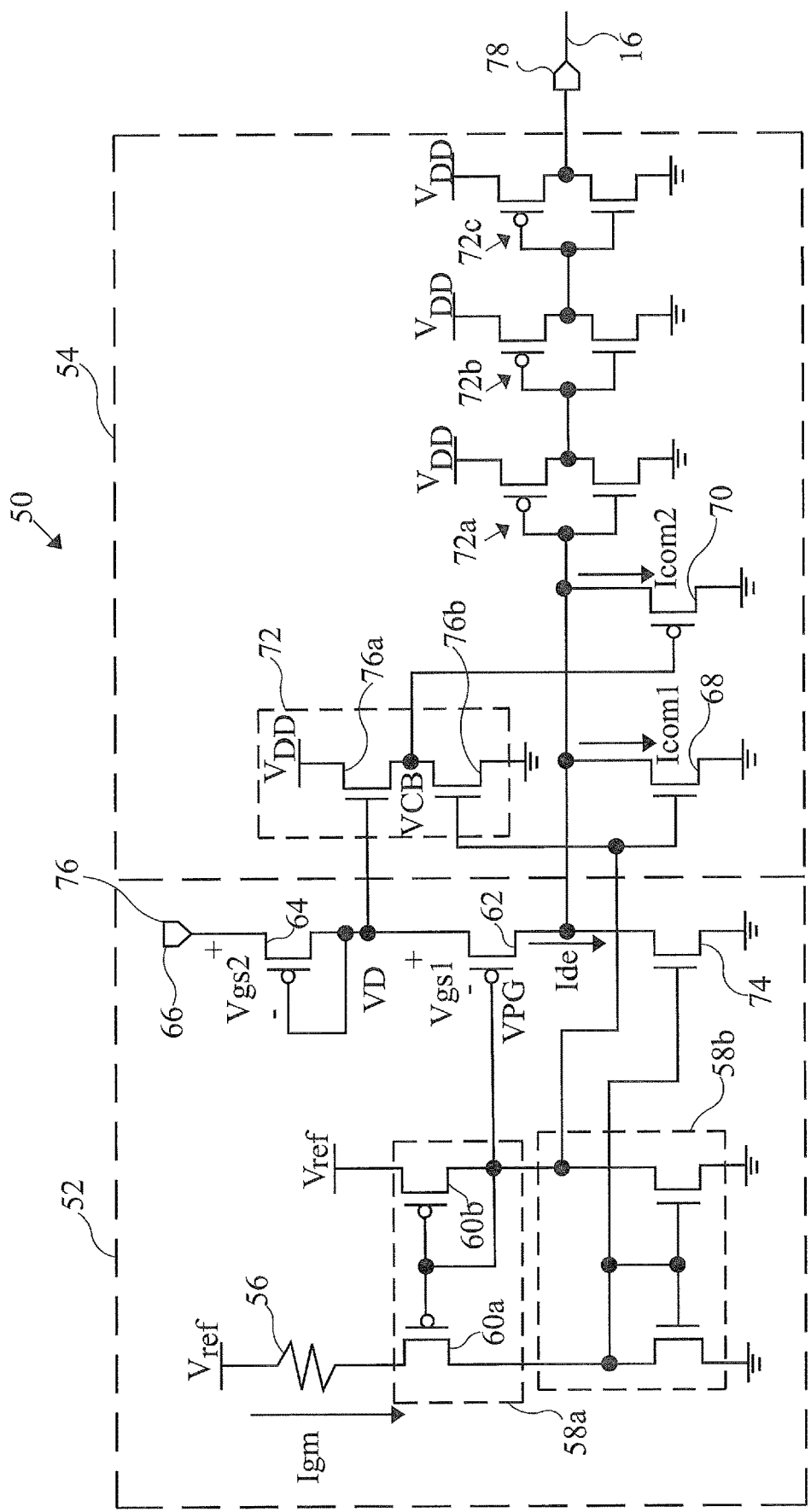
FIG. 6 illustrates a schematic diagram of a reference detector system, in accordance with some embodiments.

FIG. 6 illustrates one embodiment of a detector 50 including a compensation circuit 54 to compensate for one or more process variations, such as, current bias variation from a constant transconductance bias current and/or compensation for device aspect ratio and/or threshold voltage variation in the charge pumps 18_1-18_n. The detector 50 provides a faster response and smaller size than traditional detector circuits. The detector 50 includes a current comparator 52 and a compensator 54. The current comparator 52 is configured to compare a trigger current ($I_{de}$) to a predetermined transconductance current ($I_{gm}$). The transconductance current is predetermined during manufacture of the current comparator 52 and corresponds to the detection level (e.g., the trigger voltage $V_{trig}$, which is described in more detail below) that the current comparator 52 is configured to detect. In some embodiments, a multi-level detector 4a includes a plurality of detectors 50 each having a different transconductance current corresponding to a different detection level of the multi-level detector 4a in FIG. 2. In other embodiments, a regulator circuit 2b in FIG. 4 includes a plurality of pumping cells 24_1-24_n each having a detector 50 therein.

In some embodiments, the current comparator 52 includes two diode-connected MOS and a transistor (PMOS/NMOS) current sources 58a, 58b biased by a constant-transconductance biasing current ($I_{gm}$). A resistor 56 is coupled in series between the reference voltage $V_{ref}$ and the transistor current sources 58a, 58b to generate the constant-transconductance biasing current ($I_{gm}$). In some embodiments, the current comparator 52 includes a positive reference system configured to provide level detection during a positive phase of the load current $I_{load}$ 20 and a negative reference system configured to provide level detection during a negative phase of $I_{load}$ 20 (as shown in FIG. 2).

In some embodiments, the positive reference system includes a PMOS current source 58a. The PMOS current source 58a includes a first PMOS transistor 60a and a second PMOS transistor 60b. The first PMOS transistor 60a is coupled to an input resistor 56. The input resistor has a predetermined resistance R and is coupled to a reference voltage input $V_{ref}$. The first PMOS transistor 60a draws a constant transconductance biasing current ($I_{gm}$). The first PMOS transistor 60a is further coupled to ground and can be coupled to ground through one or more additional circuit elements, such as a negative reference system, as discussed in more detail below. The drain of the second PMOS transistor 60b is also coupled to the reference voltage $V_{ref}$. The gates of each of the PMOS devices 60a, 60b of the PMOS current source 58a are coupled together and are further coupled to the source of the second PMOS transistor 60b.

The output of the PMOS current source 58a is provided as a pass-gate voltage ($V_{PG}$) to a gate of a PMOS pass-gate 62. A first gate-source voltage $V_{gs1}$ develops between the gate and the source of the PMOS pass-gate 62. The drain of the PMOS pass-gate 62 is coupled to the drain of a first compensation transistor 68 having a source coupled to ground and a gate coupled to the gates of transistors 60a and 60b. The source of the PMOS pass-gate 62 is coupled to the drain and gate of an adjustment transistor 64. The adjustment transistor 64 can include a tapped point transistor. The adjustment transistor 64 is configured to adjust the default $V_{trig}$ voltage, for example, by providing a compensation for the bias current ($I_{gm}$). The source of the adjustment transistor 64 is coupled to a voltage input 66. In some embodiments, the voltage input 66 is equal to the output voltage $V_{out}$ of a pumping cell 24_1-24_n24_1-24_n (for example, 1V) associated with the detector 50. A second gate-source voltage $V_{gs2}$ develops between the gate and the source of the adjustment transistor 64. Although embodiments are described herein including an adjustment transistor 64, it will be appreciated that the adjustment transistor 64 can be omitted and the voltage input 66 can be coupled directly to the PMOS pass-gate 62, in accordance with alternative embodiments.

In some embodiments, a trigger voltage of the current comparator 52 is determined according to the equation:

$$V_{trig}=V_{PG}+V_{ov1}+V_{t1}+V_{ov2}+V_{t2}$$

where $V_{ov1}$ is the overdrive voltage of the PMOS pass-gate 62, $V_{t1}$ is the threshold voltage of the PMOS pass-gate 62, $V_{ov2}$ is the overdrive voltage of the adjustment transistor 64, and $V_{t2}$ is the threshold voltage of the adjustment transistor 64. The overdrive voltage of each of the PMOS pass-gate 62 and the adjustment transistor 64 is determined according to the equation:

$$V_{ov}=V_{gs}-V_t$$

where $V_{gs}$ is the gate-source voltage of the transistor and $V_t$ is the threshold voltage of the transistor.

In operation, in accordance with some embodiments, the voltage input 66 is coupled to the output of the n-bit pumping cell 8a, as described above. The voltage input 66 is configured to activate the pumping cell 24_1-24_n associated with the detector 50. For example, in some embodiments, at a threshold condition where $V_{out}=V_{trig}$, the drain of the PMOS pass-gate 62 is at a high impedance point and $V_D$ is equal to $V_{ref}$. If $V_{out}$ drop below $V_{trig}$, $V_D$ also drops, causing $V_{gs1}$ to drop and the drain of PMOS pass-gate 62 to drop off sharply. The inverter output 78 is set to high and the pumping cell 24_1-24_n is activated (and/or transitioned to a boost mode). If $V_{out}$ exceeds $V_{trig}$, $V_{gs1}$ is also high, and the drain of the PMOS pass-gate 62 increases. The output 78 is set low and the pumping cell 24_1-24_n stops pumping.

In some embodiments, the output 78 is passed through one or more static CMOS inversion circuits 72a-72c before being provided to an output 16. The one or more CMOS inversion circuits 72a-72c can provide one or more adjustments to the output, such as a timing delay, a voltage shift, and/or any other suitable adjustment. Although CMOS inversion circuits 72a-72c are illustrated, it will be appreciated that one or more of the CMOS inversion circuits 72a-72c can be replaced with any other suitable inversion circuit, such as, for example, a pseudo-NMOS inversion circuit. As shown in FIG. 2, the output is provided as part of an n-bit output 16 to the n-bit pumping cell 8a and causes one or more cells 18_1-18_n within the n-bit pumping cell 8a to charge and/or discharge, adjusting the output of the n-bit pumping cell 8a higher or lower (e.g., charging or discharging) to maintain an average output voltage. Process variations can occur during formation of each of the circuit elements resulting in process variations in one or more circuit elements, such as, for example, the resistor 56, the PMOS current source 58, and/or any other circuit element that can affect the detector level of the current comparator 52.

In some embodiments, a compensation circuit 54 is provided to compensate for process variations in the current comparator 52. In some embodiments, the compensation circuit 54 includes a first compensation transistor 68 configured to provide compensation for current bias variations from the predetermined constant transconductance bias current ($I_{gm}$). For example, in some embodiments, as $I_{gm}$ decreases, the pass-gate voltage ($V_{PG}$) increases, and each of the trigger current ($I_{de}$), the gate-source voltages ($V_{gs2}$) decrease, resulting in a trigger voltage ($V_{trig}$) less than the predetermined voltage. The decreased trigger voltage causes the detector 50 to output an activation bit to one or more pumping cells 18_1-18_n at a lower voltage than required. The first compensation transistor 68 provides a current injection to the current comparator 52 to compensate for $I_{gm}$ variations, as described in more detail below.

In some embodiments, the first compensation transistor 68 includes an NMOS transistor having a gate coupled to the gates of the current source 58a. The source of the first compensation transistor 68 is coupled to the drain of the PMOS pass-gate 62. When the gate-source voltage ($V_{gs}$) of the compensation transistor 68 is greater than the gate-drain voltage ($V_{gd}$) of the transistor 68, a compensation current ($I_{com1}$) flows across the first compensation transistor 68. The compensation current ($I_{com1}$) causes an increase and/or a decrease of the trigger current ($I_{de}$) to adjust the trigger current ($I_{de}$) to compensate for transconductance current ($I_{gm}$) variations.

In some embodiments, a second compensation transistor 70 is configured to provide compensation for device aspect ratio and/or threshold voltage variations in one or more transistors, such as, for example, the PMOS pass-gate 62. For example, variations in the threshold voltage of the PMOS pass-gate 62 increase the gate-source voltage necessary to allow a detector current to flow through the PMOS pass-gate 62. The gate-source voltage ($V_{gs1}$) for the PMOS pass-gate 62 is determined by the equation:

$$V_{gs1} = V_{ov1} + V_{t1}$$

where $V_{ov1}$ is the overdrive voltage of the PMOS pass-gate 62 and $V_{t1}$ is the threshold voltage of the PMOS pass-gate 62. Therefore, variations in the threshold voltage $V_{t1}$ of the PMOS pass-gate 62 results in changes to the detection level of the detector 50. As another example, in some embodiments, for a given (e.g., predetermined) pass-gate voltage ($V_{PG}$), any device aspect ratio (width (W)/Length (L)) variation or threshold variation in the PMOS pass-gate 62 causes a drop in the drain voltage ($V_D$) of the adjustment transistor 68, an increase in the detector current ($I_{de}$), an increase in the overdrive voltages ($V_{ov1}$, $V_{ov2}$) and an increase in the trigger voltage ($V_{trig}$). The increased trigger voltage ($V_{trig}$) causes the detector 50 to output an activation bit to one or more pumping cells 18_1-18_n close to the predetermined detector level. The second compensation transistor 70 provides a current injection to the current comparator 52 to compensate for aspect ratio and/or threshold voltage variations. In some embodiments, level shifting transistors 76a, 76b are configured to shift the voltage $V_D$ from a supply voltage to a lower, predetermined voltage to activate the second compensation transistor 70.

In some embodiments, the detector 50 includes a negative reference system. The negative reference system includes an NMOS current source 58b. The negative reference system 58b is configured to provide level detection during a negative phase of the load current $I_{load}$. The output of the NMOS current source 58b is coupled to a NMOS pass-gate 74. The NMOS current source 58b and the NMOS pass-gate 74 operate similar to the PMOS current source 58a and the PMOS pass-gate 62 described above in conjunction with the positive reference system, with the exception that the negative reference system is configured to generate a high control bit voltage when a trigger voltage is less than a reference voltage. Thus, a similar description is not repeated herein.

Although specific combinations and/or connections of MOS devices are illustrated herein, it will be appreciated by those skilled in the art that alternative connection schemes, for example flipping the drain and source connections of one or more MOS devices, would be apparent and are within the scope of this disclosure.

Figure 7A:
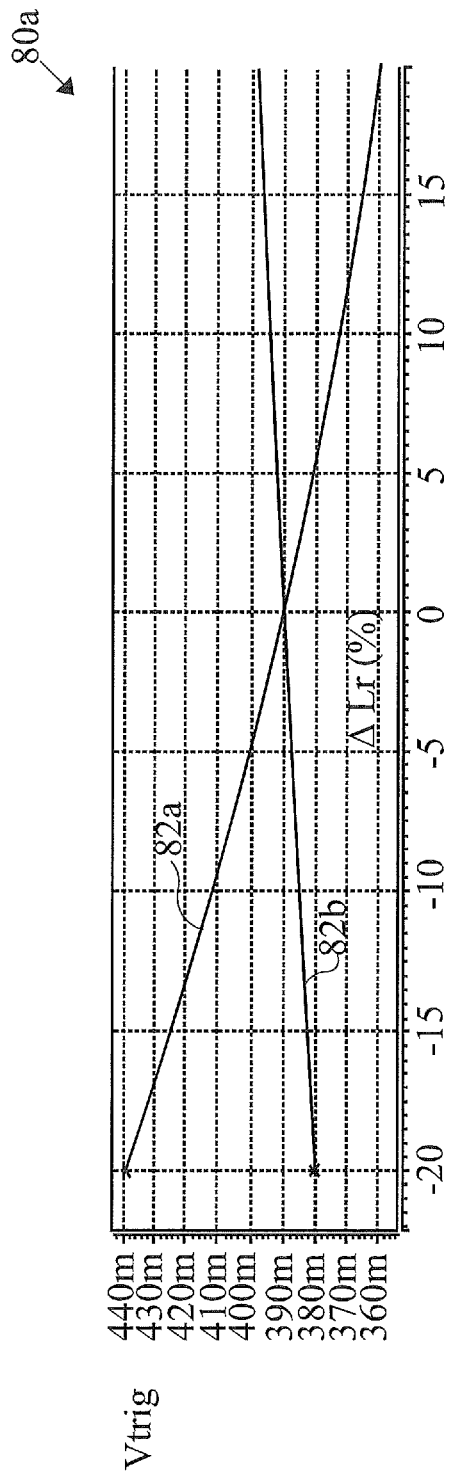
FIGS. 7A-7D are charts illustrating various parameter variations for compensated and uncompensated positive reference systems, in accordance with some embodiments.
Figure 7B:
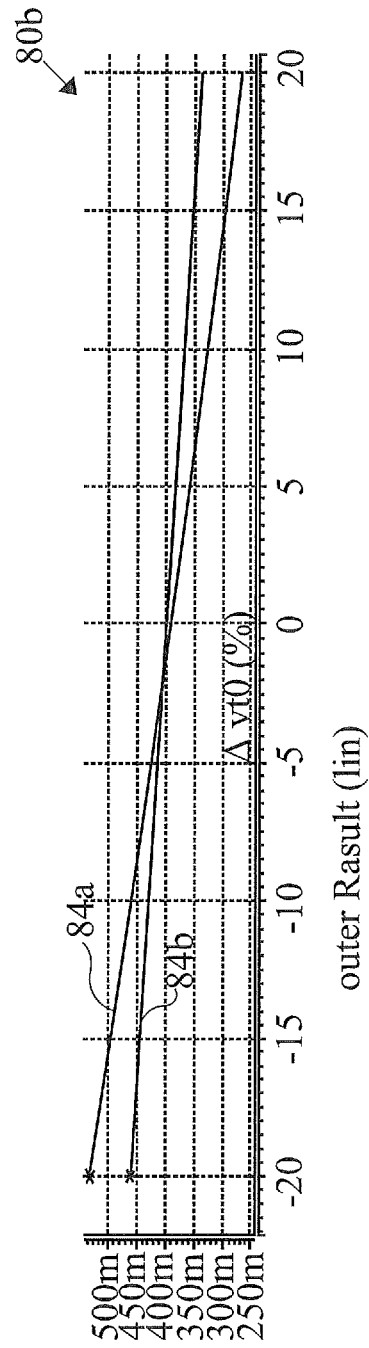
Figure 7C:
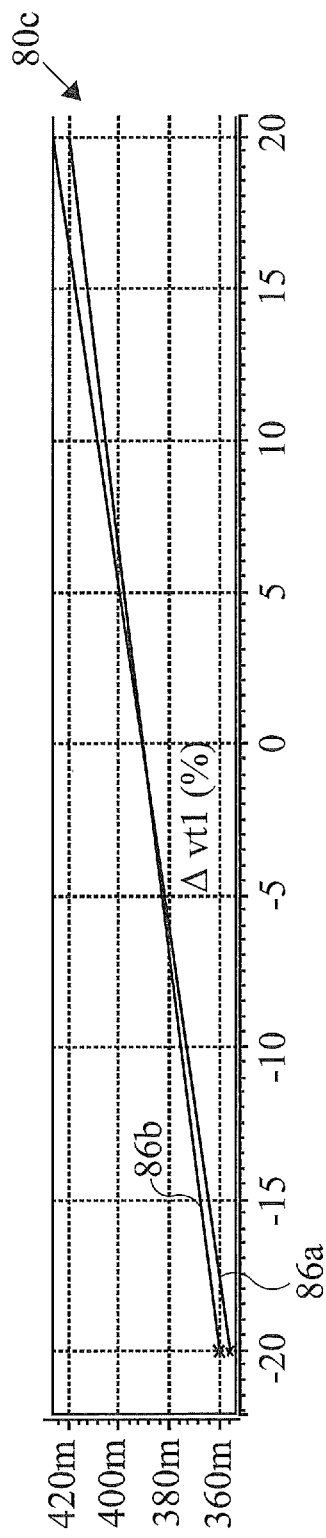
Figure 7D:
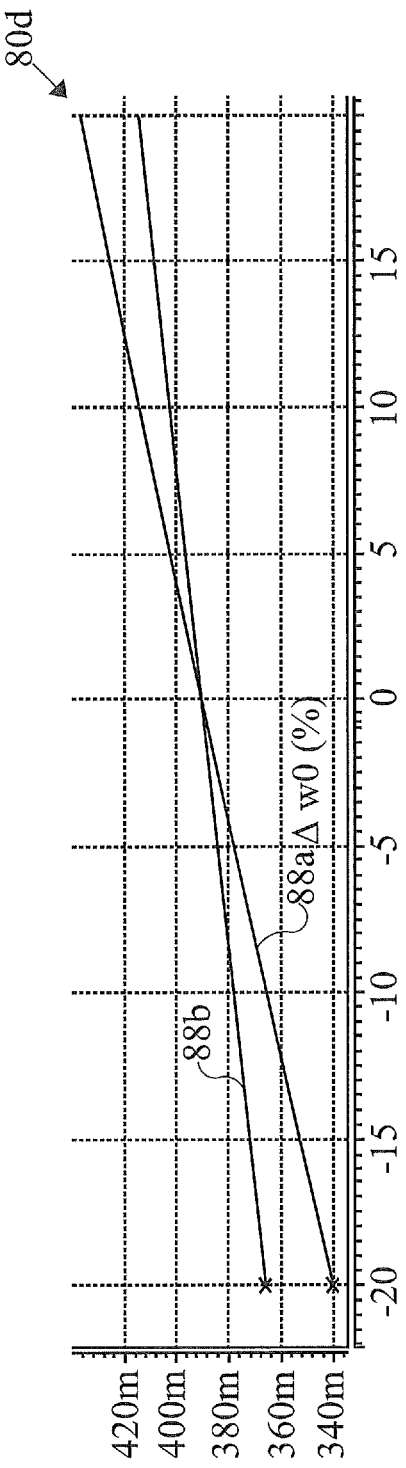

FIGS. 7A-7D provide charts 80a-80d, respectively, each chart illustrating a graph of $V_{trig}$ sensitivity (Y-axis) to various parameter variations (X-axis) with and without the compensation circuit 54. FIG. 7A illustrates $V_{trig}$ sensitivity with respect to length (L) variations of the PMOS pass-gate 62 and/or the NMOS pass-gate 74. As shown in FIG. 7A, the $V_{trig}$ sensitivity 82a without a compensation circuit 54 has much greater variance than the $V_{trig}$ sensitivity 82b with the compensation circuit 54. Similarly, FIG. 7B illustrates $V_{trig}$ sensitivity with respect to threshold variations in the NMOS pass-gate 74 without (84a) the compensation circuit 54 and with (84b) the compensation circuit. FIG. 7C illustrates $V_{trig}$ sensitivity with respect to threshold variations in the PMOS pass-gate 62 without (86a) and with (86b) the compensation circuit 54. FIG. 7D illustrates $V_{trig}$ sensitivity with respect to width (W) variations of the PMOS pass-gate 62 and/or the NMOS pass-gate 74 without (88a) and with (88b) the compensation circuit 54. As shown in each of FIGS. 7B-7D, the compensation circuit 54 reduces the variation of $V_{trig}$ for each of the identified parameters.

Figure 8A:
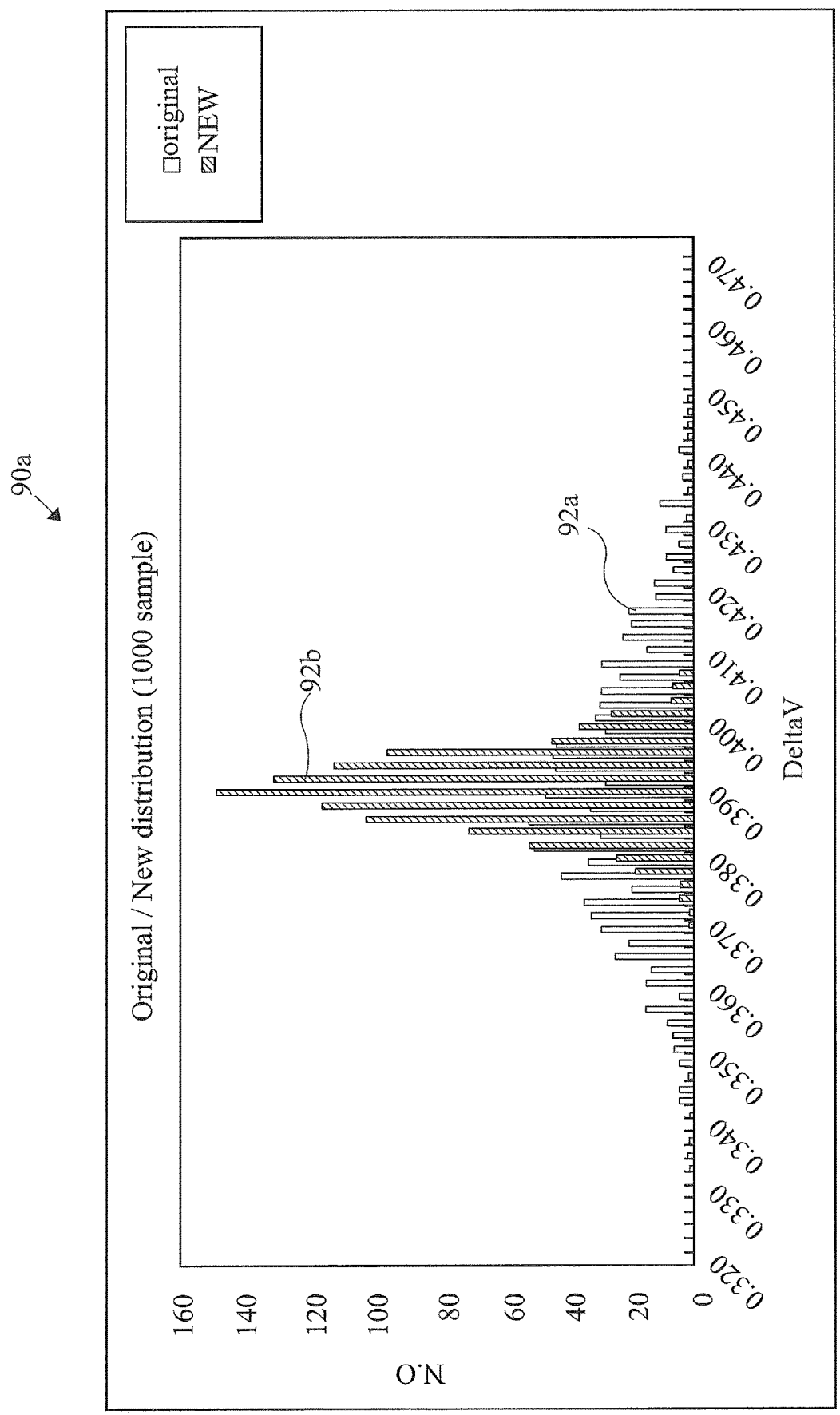
FIGS. 8A-8C are charts illustrating various output voltage distributions for compensated and uncompensated positive reference systems, in accordance with some embodiments.
Figure 8B:
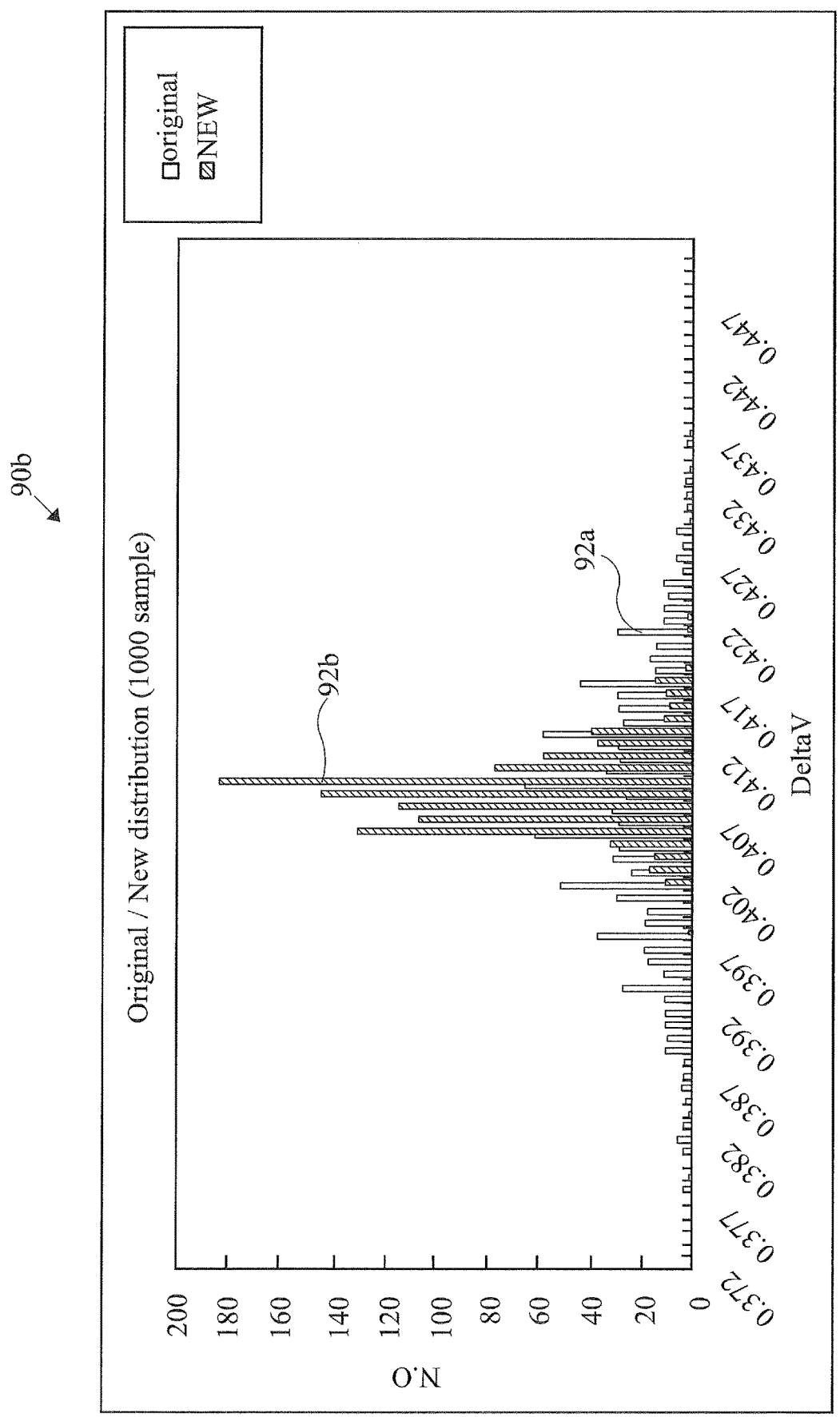
Figure 8C:
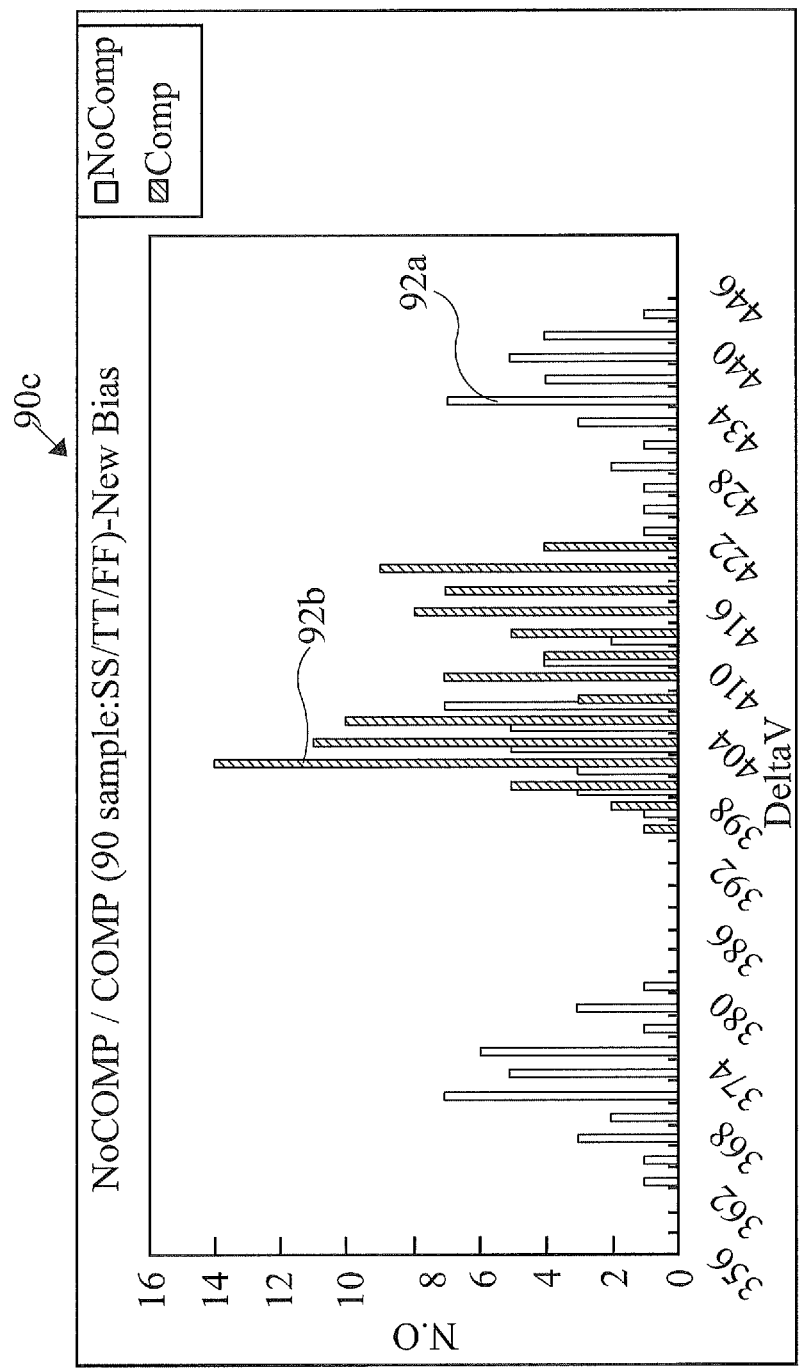

FIGS. 8A-8C provide charts 90a-90c, respectively, each chart illustrating $V_{trig}$ distribution by statistic model simulation for detectors with and without a compensation circuit 54. As shown in FIGS. 8A-8C, the compensation circuit 54 produces detectors 50 having a smaller statistical variation 92b than the statistical variation 92a of detectors without compensation circuits. The values for each of the detectors illustrated in FIGS. 8A-8C are provided below as example embodiments. It will be appreciated that the provided examples are non-limiting and the compensation circuit 54 disclosed herein can be applied to any suitable detector 50 and/or comparison circuit 52. FIG. 8A illustrates a comparison of a detector having the following parameters:

| N90 | Vmax (mV) | Vmin (mV) | Vpkpk (mV) | Vavg (mV) | Vstdev (mV) | V-3sigma (mV) |
|---|---|---|---|---|---|---|
| W/O Comp. | 450.0 | 334.0 | 116.0 | 389.6 | 19.69 | 59.06 |
| With Comp. | 407.6 | 369.2 | 38.4 | 389.5 | 5.95 | 17.85 |

FIG. 8B illustrates a comparison of a detector having the following parameters:

| N65 | Vmax (mV) | Vmin (mV) | Vpkpk (mV) | Vavg (mV) | Vstdev (mV) | V-3sigma (mV) |
|---|---|---|---|---|---|---|
| W/O Comp. | 437.2 | 377.2 | 60.0 | 407.9 | 10.27 | 30.82 |
| With Comp. | 422.8 | 397.2 | 25.6 | 408.7 | 3.03 | 9.09 |

FIG. 8C illustrates a comparison of a silicon detector having the following parameters:

| | Vmax (mV) | Vmin (mV) | Vpkpk (mV) | Vavg (mV) | Vstdev (mV) | V-3sigma (mV) |
|---|---|---|---|---|---|---|
| W/O Comp. | 442 | 362 | 80 | 403 | 26.14 | 78.41 |
| With Comp. | 420 | 394 | 26 | 407 | 7.30 | 21.90 |

As can be seen in each of the above tables, the V-3sigma value of each of the circuits with compensation is about two to three times less than the V-3sigma value of each of the circuits without compensation.

Figure 9:
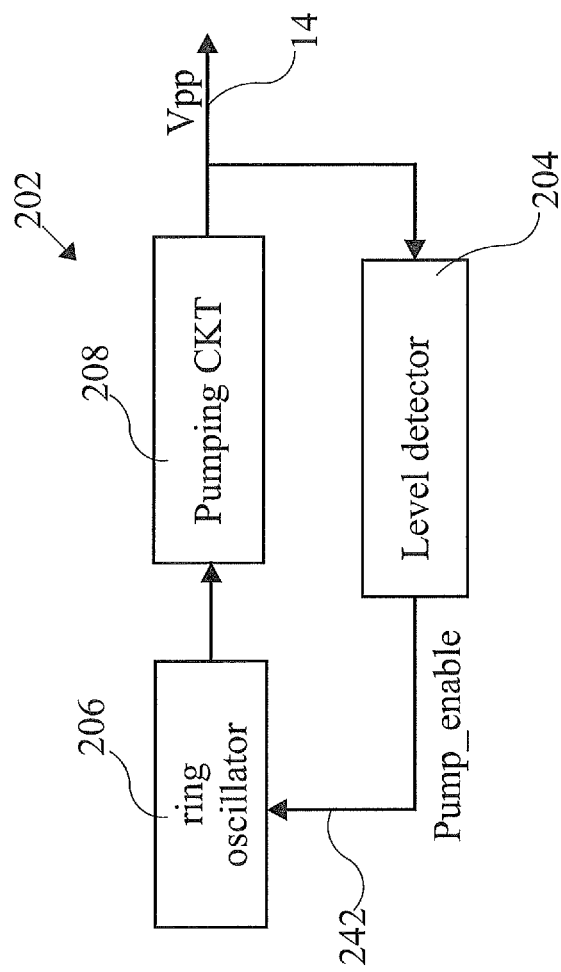
FIG. 9 illustrates a regulator circuit, in accordance with some embodiments.
Figure 10:
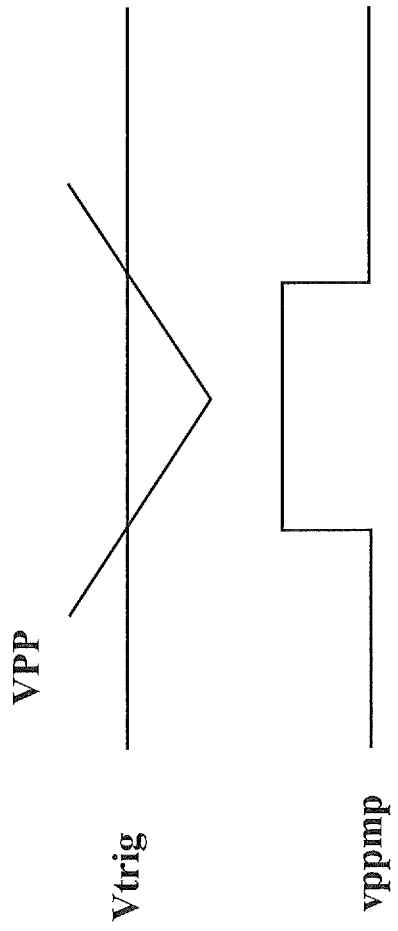
FIG. 10 is a chart illustrating a relationship between a trigger voltage, output voltage, and a pump voltage of the regulator circuit of FIG. 9.

FIG. 9 illustrates one embodiment of a regulator circuit 202, in accordance with some embodiments. The regulator circuit 202 includes a level detector 204, a charge/discharge circuit 208, and a ring oscillator 206. The level detector 204 is configured to detect an output 214 of the charge pump 208. As discussed above, the level detector 204 detects when the output $V_{pp}$ of the charge/discharge circuit 208 drops below a predetermined trigger voltage. As shown in FIG. 10, the level detector 204 generates a pump_enable signal 242 ($V_{ppmp}$) when the output $V_{pp}$ drops below the trigger voltage $V_{trig}$. The pump_enable signal 242 is provided to a ring oscillator 206, which generates an input clock signal to the charge/discharge circuit 208 to control one or more pumping cells 222 of the charge/discharge circuit 208.

Figure 11A:
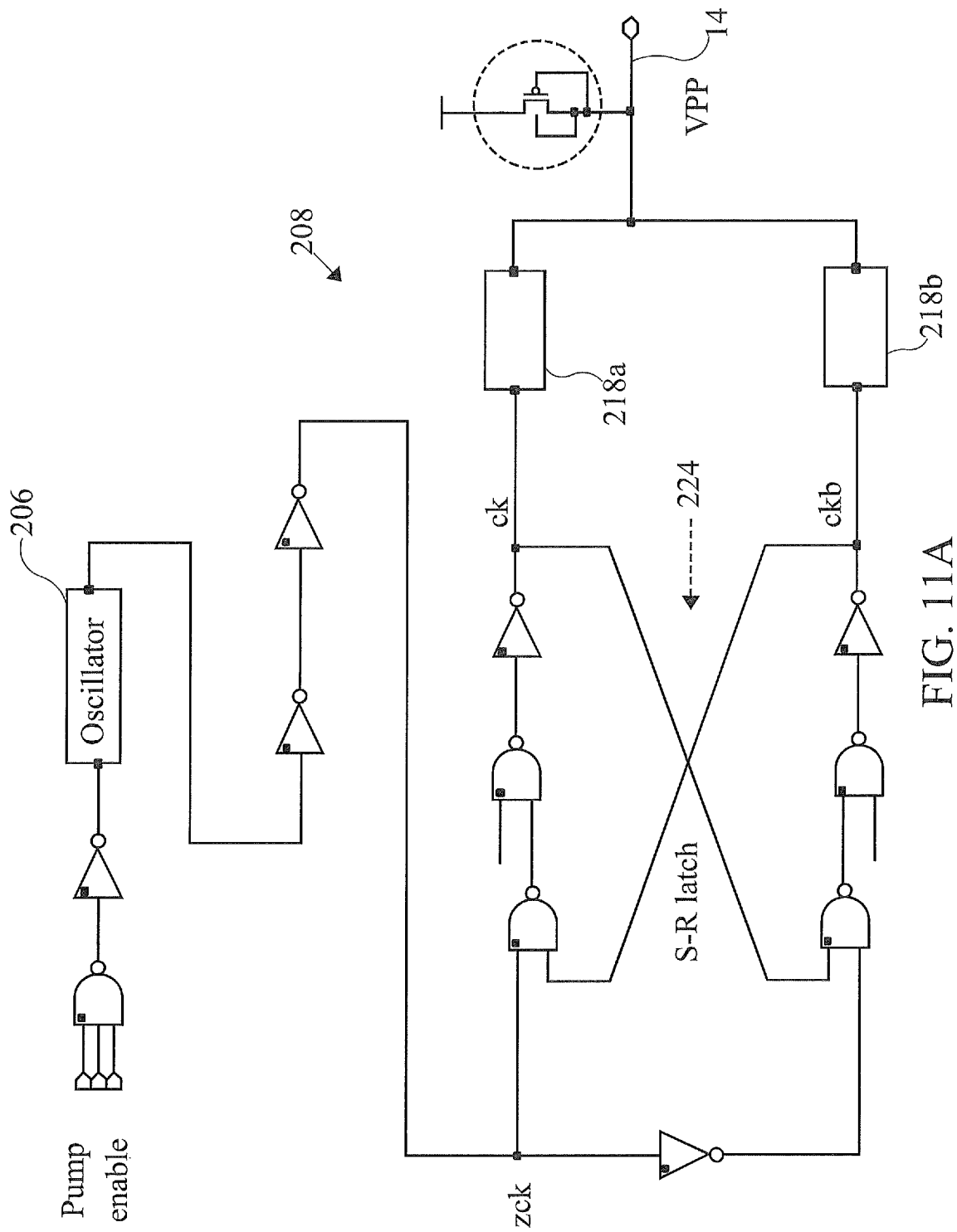
FIG. 11A illustrates a charge pump of the regulator circuit of FIG. 9, in accordance with some embodiments.

FIG. 11A illustrates a circuit schematic of one embodiment of the charge/discharge circuit 208 of the regulator circuit 202 of FIG. 9. The charge/discharge circuit 208 includes a plurality of charge pumps 218. Each of the charge pumps 218 is configured to generate a predetermined charge, such as, for example, a charge sufficient to maintain a predetermined voltage output $V_{pp}$. The charge pump 208 includes one or more logic elements, such as the S-R latch 124, configured to control the plurality of charge pumps 218. The S-R latch 224 is configured to activate a first charge pump 218a when $V_{pp}$ is below a trigger voltage. The S-R latch 224 activates a second charge pump 218b if $V_{pp}$ remains below the trigger voltage for a predetermined time period, as determined by the ring oscillator 206. In some embodiments, the S-R latch 224 the timing between the first charge pump 218a and the second charge pump 218b is equal to a pre-charge time for each of the pumps 218a, 218b.

Figure 11B:
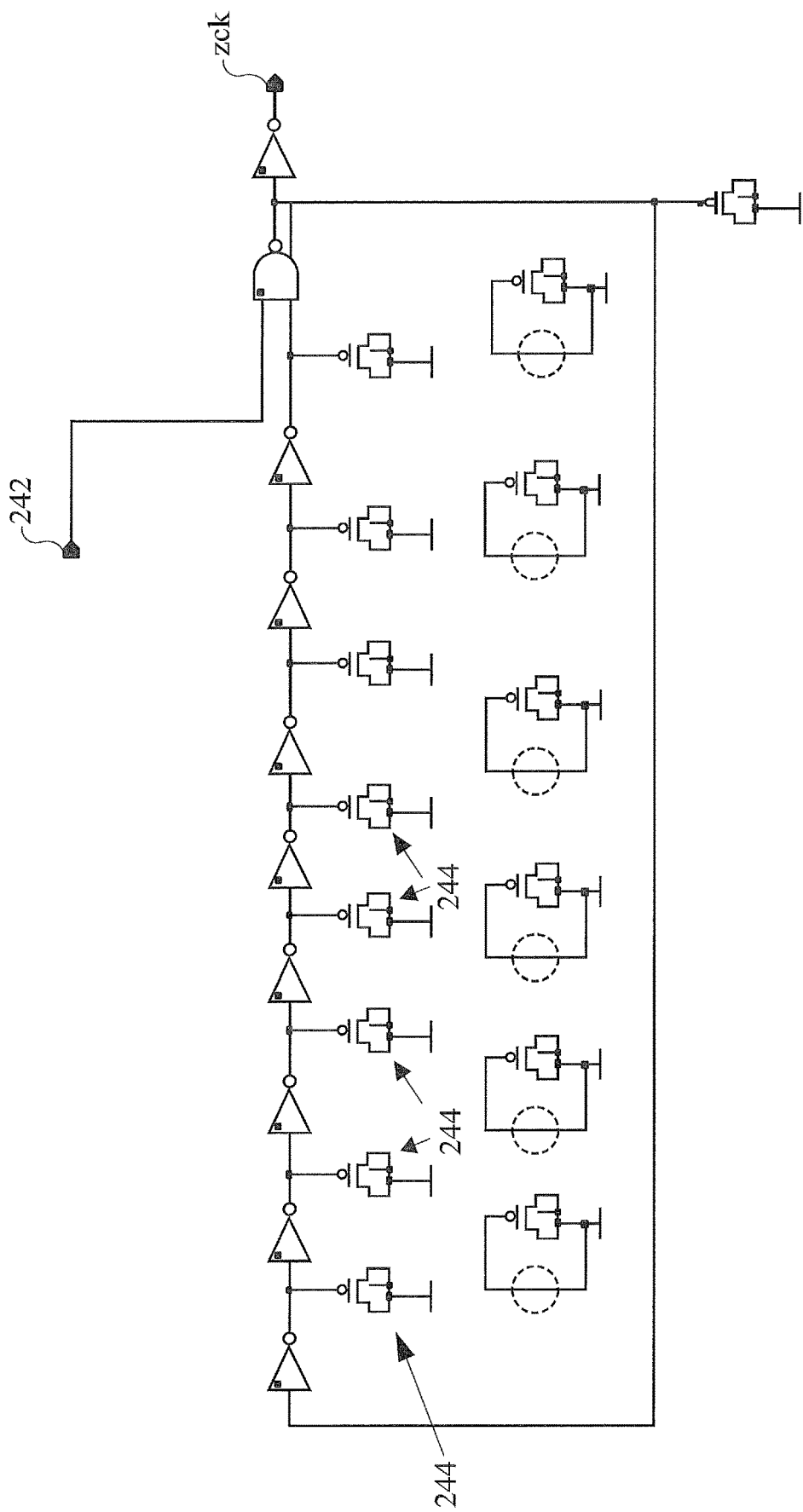
FIG. 11B illustrates a ring oscillator of the regulator circuit of FIG. 9, in accordance with some embodiments.
Figure 12:
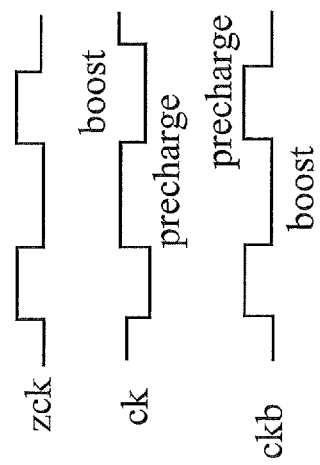
FIG. 12 illustrates a charge conservation of a boost circuit, in accordance with some embodiments.

FIG. 11B illustrates one embodiment of the oscillator 206 of the regulator circuit 202 of FIG. 9. The oscillator 206 generates an output clock signal zck for the charge/discharge circuit 208. The oscillator 206 receives a pump_enable signal 242 from the detector 204. When the pump_enable signal 242 is high, the oscillator 206 outputs the clock signal zck, which is generated by a plurality of oscillation elements 244. The clock signal zck is provided as an input to the charge/discharge circuit 208 and drives activation of the charge pumps 218a, 218b therein. FIG. 12 illustrates one embodiment of the oscillator clock zck, control clock ck, and inverse control clock signals ckb configured to control the charge pump 108 as illustrated in FIG. 11A.

Figure 13:
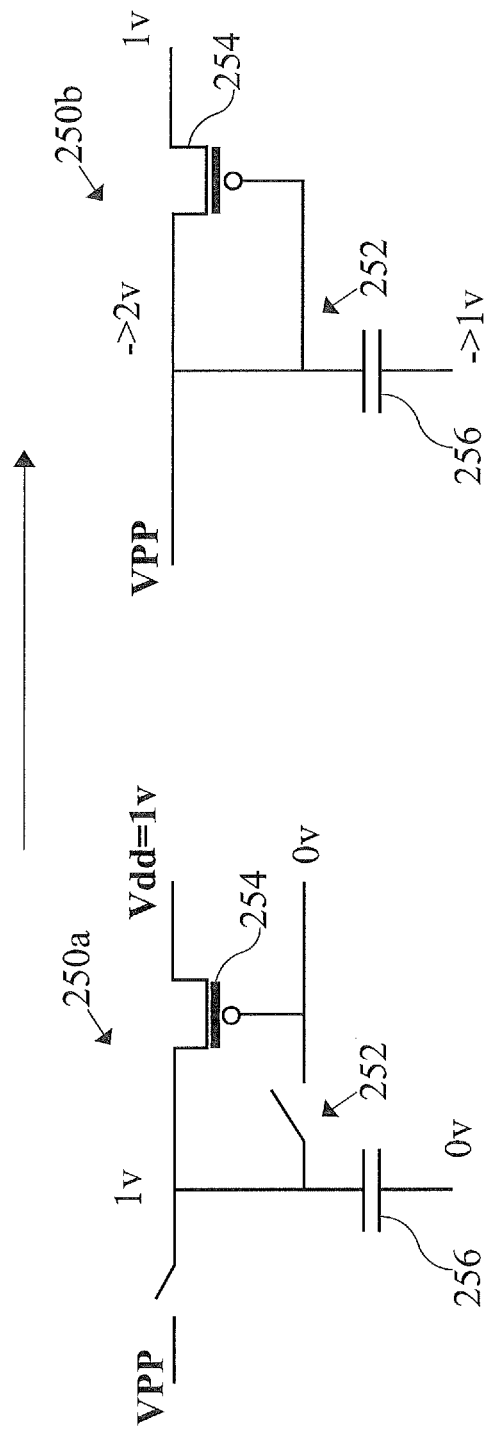
FIG. 13 is a chart illustrating a plurality of signals of the boost circuit of FIG. 12, in accordance with some embodiments.

FIG. 13 illustrates a circuit view of one embodiment of an output $V_{pp}$ of a charge pump 208a configured to provide a pre-charge voltage of 1V and a boost voltage of 2V. A pre-charge configuration 250a is represented by an open switch 252 coupled between the gate of a transistor 254 and a capacitor 256. When the switch 252 is in an open position, the capacitor 256 is charged and the capacitor voltage is one-volt. When the switch 250 is closed, the charge pump 208a is transitioned to a boost mode 250b, and the capacitor 254 maintains a one-volt charge, which causes the output voltage $V_{pp}$ to increase to two-volts (due to charge conservation).

In various embodiments, a system including a detector circuit having a plurality of detectors and a multi-cell charge/discharge circuit. Each of the plurality of detectors has a predetermined threshold voltage. The charge/discharge circuit includes a plurality of charge pumps. Each of the charge pumps is configured to generate a predetermined charge.

In various embodiments, a detector circuit includes a current comparator configured to generate an output by comparing a reference voltage to a trigger voltage and a compensation circuit comprising at least one compensation transistor configured to compensate for at least one process variation of the current comparator.

In various embodiments, a regulator system includes a plurality of detectors. Each of the plurality of detectors includes a current comparator configured to generate an output by comparing a reference voltage to a trigger voltage and a compensation circuit having at least one compensation transistor configured to compensate for at least one process variation of the current comparator. A multi-cell charge/discharge circuit includes a plurality of charges pump. Each of the charge pumps is associated with at least one of the plurality of detectors and is configured to generate a predetermined charge.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A detector circuit, comprising:
   a comparator configured to generate an output based on a comparison of a reference voltage to a trigger voltage; and
   a compensation circuit comprising at least one compensation transistor configured to compensate for at least one process variation of the comparator, wherein the compensation circuit includes at least one compensation transistor configured to compensate for process variations in one or more of a width, a length, or a threshold voltage of at least one transistor of the comparator, and wherein the at least one compensation transistor comprises a PMOS transistor having a gate coupled to an output of a two-NMOS transistor comparison circuit, a source coupled to pass-gate transistor of the comparator, and a drain coupled to ground.

2. The detector circuit of claim 1, wherein the compensation circuit includes at least one compensation transistor configured to compensate for variations in a constant transconductance bias current of the comparator.

3. The detector circuit of claim 2, wherein the at least one compensation transistor comprises an NMOS transistor having a gate coupled to an output of a current source of the comparator, a source coupled to a pass-gate transistor of the comparator, and a drain coupled to ground.

4. The detector circuit of claim 1, wherein the current comparator comprises:
a positive reference system including a PMOS current source and a PMOS pass-gate;
a negative reference system including an NMOS current source and an NMOS pass-gate; and
a transistor coupled between a pump output voltage input and at least one of the PMOS pass-gate and the NMOS pass-gate.

5. The detector circuit of claim 4, wherein the positive reference system is configured to generate an output signal for at least one charge pump during a positive phase of a load current, and wherein the negative reference system is configured to generate the output signal for the at least one charge pump during a negative phase of the load current.

6. The detector circuit of claim 5, wherein the detector circuit is configured to generate an n-bit output to activate one or more of the at least one charge pump based on a comparison between a reference voltage and an output voltage of a multi-cell charge/discharge circuit.

7. A regulator system, comprising:
a plurality of detectors each comprising:
a current comparator configured to generate an output by comparing a reference voltage to a trigger voltage, wherein the trigger voltage is determined by one or more process variations of the current comparator; and
a compensation circuit comprising at least one compensation transistor configured to compensate for at least one process variations of the current comparator, wherein the compensation circuit includes at least one compensation transistor configured to compensate for process variations in one or more of a width, a length, or a threshold voltage of at least one transistor of the current comparator, and wherein the at least one compensation transistor comprises a PMOS transistor having a gate coupled to an output of a two-NMOS transistor comparison circuit, a source coupled to pass-gate transistor of the current comparator, and a drain coupled to ground; and
a plurality of charge pumps each associated with at least one of the plurality of detectors, wherein each of the charge pumps is configured to generate a predetermined charge.

8. The regulator system of claim 7, wherein the predetermined charge generated by each of the charge pumps is equal.

9. The regulator system of claim 7, wherein the at least one compensation transistor is further configured to compensate for variations in a constant transconductance bias current of the comparator.

10. The regulator system of claim 9, wherein the at least one compensation transistor comprises an NMOS transistor having a gate coupled to an output of a current source of the current comparator, a source coupled to a pass-gate transistor of the current comparator, and a drain coupled to ground.

11. The regulator system of claim 7, wherein each of the plurality of detectors is configured to generate an n-bit output to activate a respective one of the plurality of charge pumps based on a comparison between a reference voltage and an output voltage of a multi-cell charge/discharge circuit.

12. A detector circuit, comprising:
a comparator configured to generate an output based on a comparison of a reference voltage to a trigger voltage;
a compensation circuit comprising at least one compensation transistor configured to compensate for at least one process variation of the comparator; and
a plurality of charge pumps each configured to generate a pre-charge voltage and a boost voltage, wherein each of the plurality of charge pumps is configured to output the pre-charge voltage in response to a first signal and the boost voltage in response to a second signal, wherein the compensation circuit includes at least one compensation transistor configured to compensate for process variations in one or more of a width, a length, or a threshold voltage of at least one transistor of the current comparator, and wherein the at least one compensation transistor comprises a PMOS transistor having a gate coupled to an output of a two-NMOS transistor comparison circuit, a source coupled to pass-gate transistor of the current comparator, and a drain coupled to ground.

13. The detector circuit of claim 12, wherein the compensation circuit includes at least one compensation transistor configured to compensate for variations in the reference voltage.

14. The detector circuit of claim 13, wherein the at least one compensation transistor comprises an NMOS transistor having a gate coupled to an output of a current source of the current comparator, a source coupled to a pass-gate transistor of the current comparator, and a drain coupled to ground.

15. The detector circuit of claim 12, wherein the detector circuit is configured to generate an n-bit output to activate one or more of the plurality of charge pumps based on an output of the comparator.

16. The detector circuit of claim 15, wherein n is a number of charge pumps in the plurality of charge pumps.

17. The detector circuit of claim 12, wherein the predetermined charge generated by each of the charge pumps is equal.

18. The detector circuit of claim 12, wherein each of the plurality of pumping cells are shunted together.

19. The detector circuit of claim 12, wherein each of the charge pumps is configured to generate an identical charge.

20. The detector circuit of claim 12, wherein the detector circuit is configured to generate an n-bit output to activate one or more of the charge pumps based on a comparison between a reference voltage and an output voltage of the multi-cell charge/discharge circuit.

* * * * *